(12) United States Patent
Kawashima et al.

(10) Patent No.: US 11,671,109 B2
(45) Date of Patent: Jun. 6, 2023

(54) CONSTANT CURRENT DIGITAL TO ANALOG CONVERTER SYSTEMS AND METHODS

(71) Applicant: Apple Inc., Cupertino, CA (US)

(72) Inventors: Toshitsugu Kawashima, Kawasaki (JP); Jose Antonio Gómez Urdampilleta, Munich (DE); Masahiro Takeuchi, Adachi-ku (JP); Yohei Ishizone, Yokohama (JP); Ryo Endo, Tamamura-machi (JP)

(73) Assignee: Apple Inc., Cupertino, CA (US)

( * ) Notice: Subject to any disclaimer, the term of this patent is extended or adjusted under 35 U.S.C. 154(b) by 213 days.

(21) Appl. No.: 16/740,184

(22) Filed: Jan. 10, 2020

(65) Prior Publication Data

US 2021/0099185 A1 Apr. 1, 2021

Related U.S. Application Data

(60) Provisional application No. 62/907,444, filed on Sep. 27, 2019.

(51) Int. Cl.
*H03M 1/78* (2006.01)
*H03M 1/80* (2006.01)
*H03M 1/08* (2006.01)
*H03M 1/68* (2006.01)

(52) U.S. Cl.
CPC .............. *H03M 1/808* (2013.01); *H03M 1/08* (2013.01); *H03M 1/687* (2013.01)

(58) Field of Classification Search
CPC ........ H03M 1/765; H03M 1/785; H03M 1/76; H03M 1/682; H03M 1/747; H03M 1/808; H03M 1/06; H03M 1/365; H03M 1/687; H03M 1/0678; H03M 1/0612; H03M 1/0682; H03M 1/0863
USPC ......................................... 341/144, 154, 137
See application file for complete search history.

(56) References Cited

U.S. PATENT DOCUMENTS

| | | | | |
|---|---|---|---|---|
| 3,755,807 A | * | 8/1973 | Brown | H03M 1/74 341/154 |
| 5,808,576 A | * | 9/1998 | Chloupek | H03M 1/687 341/144 |
| 5,831,566 A | * | 11/1998 | Ginetti | H03M 1/765 341/144 |
| 6,384,762 B2 | * | 5/2002 | Brunolli | H03M 1/682 341/154 |
| 6,744,244 B2 | * | 6/2004 | Liu | H03G 1/0088 323/298 |

(Continued)

*Primary Examiner* — Linh V Nguyen
(74) *Attorney, Agent, or Firm* — Fletcher Yoder P.C.

(57) ABSTRACT

An electronic device may include a digital to analog converter receiving digital signals and outputting analog signals based on the received digital signals. The electronic device may also include a power source to supply current to the digital to analog converter. The digital to analog converter may include a first resistor ladder section to electrically couple an output node of the digital to analog converter to the power source via a first number of resistors in series. The digital to analog converter may also include a second resistor ladder section to electrically couple the output node to a reference voltage via a second number of resistors in series. The sum of the first number of resistors in series and the second number of resistors in series may be the same for each of the different analog signals.

20 Claims, 10 Drawing Sheets

(56) References Cited

U.S. PATENT DOCUMENTS

| | | | |
|---|---|---|---|
| 7,098,831 B2* | 8/2006 | Confalonieri | H03M 1/687 |
| | | | 341/145 |
| 7,259,706 B2* | 8/2007 | Haurie | H03M 1/682 |
| | | | 341/154 |
| 7,592,940 B2* | 9/2009 | Sung | H03M 1/682 |
| | | | 341/145 |
| 8,618,971 B1* | 12/2013 | Li | H03M 1/68 |
| | | | 341/145 |
| 9,124,296 B2* | 9/2015 | Dempsey | H03M 1/1061 |
| 9,825,644 B2* | 11/2017 | Kim | G09G 3/2007 |
| 10,128,865 B1* | 11/2018 | Yang | H03M 1/682 |
| 10,735,020 B2* | 8/2020 | Gowdhaman | H03M 1/785 |
| 2005/0116852 A1* | 6/2005 | Otake | H03M 1/765 |
| | | | 341/154 |

* cited by examiner

CONSTANT CURRENT DIGITAL TO ANALOG CONVERTER SYSTEMS AND METHODS

CROSS-REFERENCE TO RELATED APPLICATIONS

This application claims priority to U.S. Provisional Patent Application No. 62/907,444, entitled "Constant Current Digital To Analog Converter Systems And Methods," filed on Sep. 27, 2019, which is incorporated herein by reference in its entirety for all purposes.

BACKGROUND

This disclosure generally relates to digital to analog converters (DACs).

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Numerous electronic devices—including televisions, portable phones, computers, wearable devices, vehicle dashboards, virtual-reality glasses, and more—utilize DACs to generate analog electrical signals from digitally coded data. For example, an electronic device may use one or more DACs to drive pixels of an electronic display at specific voltages based on digitally coded image data to produce the specific luminance level outputs to display an image. In some scenarios, different output voltages of a DAC may draw different amounts of current from the power supply feeding the DAC. However, the power supply feeding the DAC may also supply power to one or more other components of the electronic device. Moreover, changes in current draw of the DAC may cause oscillations in the voltage of the power supply, which may have adverse effects (e.g., voltage inaccuracies) on the DAC output and/or for the other components of the electronic device that may be sensitive to changes in input voltage. Such effects may manifest as malfunctions or undesirable artifacts displayed on the electronic display.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

An electronic device may use one or more digital to analog converters (DACs) to convert digitally coded data (e.g., coded via binary code, grey-code, thermometer code, etc.) to a corresponding analog output voltage. In some embodiments, the DAC may include a resistor ladder to vary the output voltage by changing the impedance before and/or after (e.g., with respect to current flow) an output node to the power supply and ground, respectively. For example, switches (e.g., transistors) may be used to connect or disconnect a supply voltage (e.g., VDD) at locations in the resistor ladder before the output node and to connect or disconnect a ground (e.g., VSS) at locations in the resistor ladder after the output node.

Moreover, in some embodiments, the switches may be utilized to increase and/or decrease the impedance before and after the output node such that the total impedance between the supply voltage and the ground remains approximately the same regardless of output voltage. For example, to increase the output voltage at the output node, one or more switches may be turned on before the output node to decrease the impedance between the supply voltage and the output node. Additionally, switches may be operated to increase the impedance between ground and the output node to effectively move the output node "up" the resistor ladder to a higher output voltage, while maintaining a constant total impedance between the supply voltage and the ground.

Additionally, in some embodiments, the DAC may be coded using thermometer coding. The thermometer coding may facilitate simplified operation of the switches by correlating each digit of the string of digital data to one or more switches, such that, for example, as the thermometer coded digital data increases in value by 1, one switch is turned on and one switch is turned off. Additionally, in some embodiments, thermometer coding may also reduce the likelihood of bit-to-bit skew. As such, by varying the impedance of different sections of the resistor ladder and/or by utilizing thermometer coding, a DAC of an electronic device may generate analog outputs that are less susceptible to error and/or have a more uniform current draw on the power supply, which may lead to less variation in the power supply voltage level.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
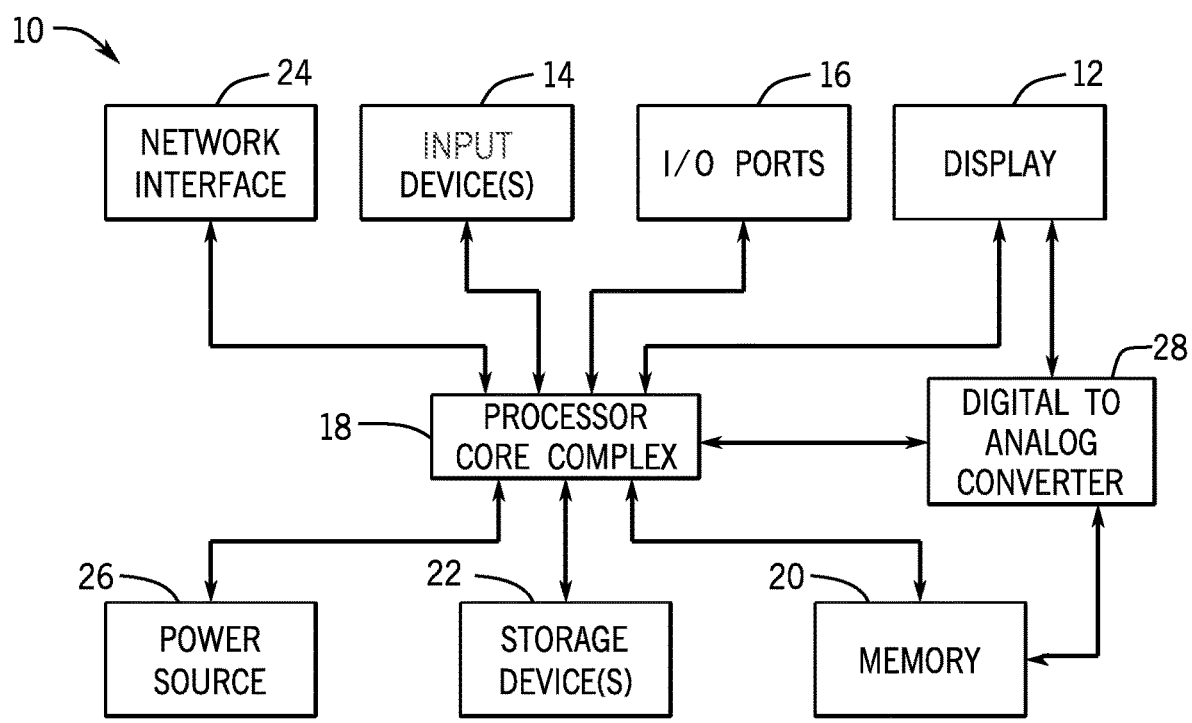
FIG. 1 is a block diagram of an electronic device that includes a digital to analog converter, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Numerous electronic devices—including televisions, portable phones, computers, wearable devices, vehicle dashboards, virtual-reality glasses, and more—utilize digital to analog converters (DACs) to generate analog electrical signals from digitally coded data (e.g., coded via binary code, grey-code, thermometer code, etc.). For example, an electronic device may use one or more DACs to drive pixels of an electronic display at specific voltages based on digitally coded image data to produce the specific luminance level outputs to display an image. However, in some scenarios, different output voltages of a DAC may draw different amounts of current from the power source feeding the DAC, which may cause oscillations in the voltage of the power source. Such fluctuations in supply voltage may have adverse effects (e.g., causing malfunctions or undesirable artifacts displayed on the electronic display) on the DAC output and/or for the other components of the electronic device also drawing power from the power source.

To help minimize oscillations in the supply voltage, in one embodiment of the present disclosure, a DAC may maintain a stable total impedance between the supply voltage and reference voltage (e.g., ground), and, therefore, maintain a constant current draw on the power source. For example, the DAC may include a resistor ladder to vary the output voltage by changing the impedance before and/or after (e.g., with respect to current flow) an output node relative to the power supply and ground, respectively. Switches (e.g., transistors) may be used to connect or disconnect a supply voltage (e.g., VDD) at locations in the resistor ladder before the output node and to connect or disconnect the reference voltage (e.g., VSS) at locations in the resistor ladder after the output node.

The switches may be utilized to increase and/or decrease the impedance before and after the output node such that the total impedance between the supply voltage and the reference voltage remains approximately the same (e.g., less than ten percent variation, less than five percent variation, less than one percent variation, etc.), regardless of output voltage. For example, to increase the output voltage at the output node, one or more switches may be turned on before the output node to decrease the impedance between the supply voltage and the output node. Additionally, switches may be operated to increase the impedance between the reference voltage and the output node to effectively move the output node "up" the resistor ladder to a higher output voltage, while maintaining a constant total impedance between the supply voltage and the reference voltage.

Additionally, in some embodiments, the DAC may be coded using thermometer coding. The thermometer coding may facilitate simplified operation of the switches by correlating each digit of the string of digital data to a pair of switches, such that, for example, as the thermometer coded digital data increases in value by 1, one switch is turned on and one switch is turned off. As should be appreciated, separate bits and/or bit strings may also be used to control each switch. Additionally, in some embodiments, thermometer coding may also reduce the likelihood of bit-to-bit skew.

As such, by varying the impedance of different sections of the resistor ladder and/or by utilizing thermometer coding, a DAC of an electronic device may generate analog outputs that are less susceptible to error and/or have a more uniform current draw on the power supply, which may lead to less variation in the power supply voltage level. As should be appreciated, although disclosed herein as used in certain implementations, the techniques disclosed herein may be used in any suitable DAC and for any suitable conversion of a digital signal to an analog signal.

To help illustrate, an electronic device 10, which includes an electronic display 12, is shown in FIG. 1. As will be described in more detail below, the electronic device 10 may be any suitable electronic device 10, such as a computer, a mobile phone, a portable media device, a tablet, a television, a virtual-reality headset, a vehicle dashboard, and the like. Thus, it should be noted that FIG. 1 is merely one example of a particular implementation and is intended to illustrate the types of components that may be present in an electronic device 10.

In the depicted embodiment, the electronic device 10 includes the electronic display 12, one or more input devices 14, one or more input/output (I/O) ports 16, a processor core complex 18 having one or more processor(s) or processor cores, local memory 20, a main memory storage device 22, a network interface 24, a power source 26, and one or more digital to analog converters (DACs) 28. The various components described in FIG. 1 may include hardware elements (e.g., circuitry), software elements (e.g., a tangible, non-transitory computer-readable medium storing instructions), or a combination of both hardware and software elements. It should be noted that the various depicted components may be combined into fewer components or separated into additional components. For example, the local memory 20 and the main memory storage device 22 may be included in a single component. Additionally or alternatively, the DAC 28 may be included in the electronic display 12.

As depicted, the processor core complex 18 is operably coupled with local memory 20 and the main memory storage device 22. Thus, the processor core complex 18 may execute instructions stored in local memory 20 and/or the main memory storage device 22 to perform operations, such as generating and/or transmitting image data. As such, the processor core complex 18 may include one or more general purpose microprocessors, one or more application specific integrated circuits (ASICs), one or more field programmable logic arrays (FPGAs), or any combination thereof.

In addition to instructions, the local memory 20 and/or the main memory storage device 22 may store data to be processed by the processor core complex 18. Thus, in some embodiments, the local memory 20 and/or the main memory storage device 22 may include one or more tangible, non-transitory, computer-readable mediums. For example, the local memory 20 may include random access memory (RAM) and the main memory storage device 22 may include read only memory (ROM), rewritable non-volatile memory such as flash memory, hard drives, optical discs, and/or the like.

As depicted, the processor core complex 18 is also operably coupled with the network interface 24. In some embodiments, the network interface 24 may facilitate data communication with another electronic device and/or a communication network. For example, the network interface 24 (e.g., a radio frequency system) may enable the electronic device 10 to communicatively couple to a personal area network (PAN), such as a Bluetooth network, a local area network (LAN), such as an 802.11x Wi-Fi network, and/or a wide area network (WAN), such as a 4G or LTE cellular network.

Additionally, as depicted, the processor core complex 18 is operably coupled to the power source 26. In some embodiments, the power source 26 may provide electrical power to one or more components in the electronic device 10, such as the processor core complex 18, the electronic display 12, and/or the DAC 28. Thus, the power source 26 may include any suitable source of energy, such as a rechargeable lithium polymer (Li-poly) battery and/or an alternating current (AC) power converter.

Furthermore, as depicted, the processor core complex 18 is operably coupled with the one or more I/O ports 16. In some embodiments, I/O ports 16 may enable the electronic device 10 to interface with other electronic devices. For example, when a portable storage device is connected, the I/O port 16 may enable the processor core complex 18 to communicate data with the portable storage device.

As depicted, the electronic device 10 is also operably coupled with the one or more input devices 14. In some embodiments, an input device 14 may facilitate user interaction with the electronic device 10, for example, by receiving user inputs. Thus, an input device 14 may include a button, a keyboard, a mouse, a trackpad, and/or the like. Additionally, in some embodiments, an input device 14 may include touch-sensing components in the electronic display 12. In such embodiments, the touch sensing components may receive user inputs by detecting occurrence and/or position of an object touching the surface of the electronic display 12.

In addition to enabling user inputs, the electronic display 12 may include a display panel with one or more display pixels. The electronic display 12 may control light emission from its display pixels (e.g., via the DAC 28) to present visual representations of information, such as a graphical user interface (GUI) of an operating system, an application interface, a still image, or video content, by displaying frames based at least in part on corresponding image data (e.g., image pixel data corresponding to individual pixel positions). The electronic display 12 may take the form of a liquid crystal display (LCD), a light emitting diode (LED) display, an organic light emitting diode (OLED) display, a plasma display, or the like.

As depicted, the electronic display 12 is operably coupled to the processor core complex 18. In this manner, the electronic display 12 may display images based at least in part on image data received from an image data source, such as the processor core complex 18 and/or the network interface 24, an input device 14, and/or an I/O port 16. In some embodiments, the image data source may generate source image data to create a digital representation of the image to be displayed. In other words, the image data is generated such that the image view on the electronic display 12 accurately represents the intended image. To facilitate accurately representing an image, image data may be processed before being supplied to the electronic display 12, for example, via a display pipeline implemented in the processor core complex 18 and/or image processing circuitry.

The display pipeline may perform various processing operations, such as spatial dithering, temporal dithering, pixel color-space conversion, luminance determination, luminance optimization, image scaling, and/or the like. Based on the image data from the image data source and/or processed image data from the display pipeline, target luminance values for each display pixel may be determined. Moreover, the target luminance values may be mapped to analog voltage values (e.g., generated by the DAC 28), and the analog voltage value corresponding to the target luminance for a display pixel at a particular location may be applied to that display pixel to facilitate the desired luminance output from the display. For example, a first display pixel desired to be at a lower luminance output may have a lower voltage applied than a second display pixel desired to be at a higher luminance output.

Figure 2:
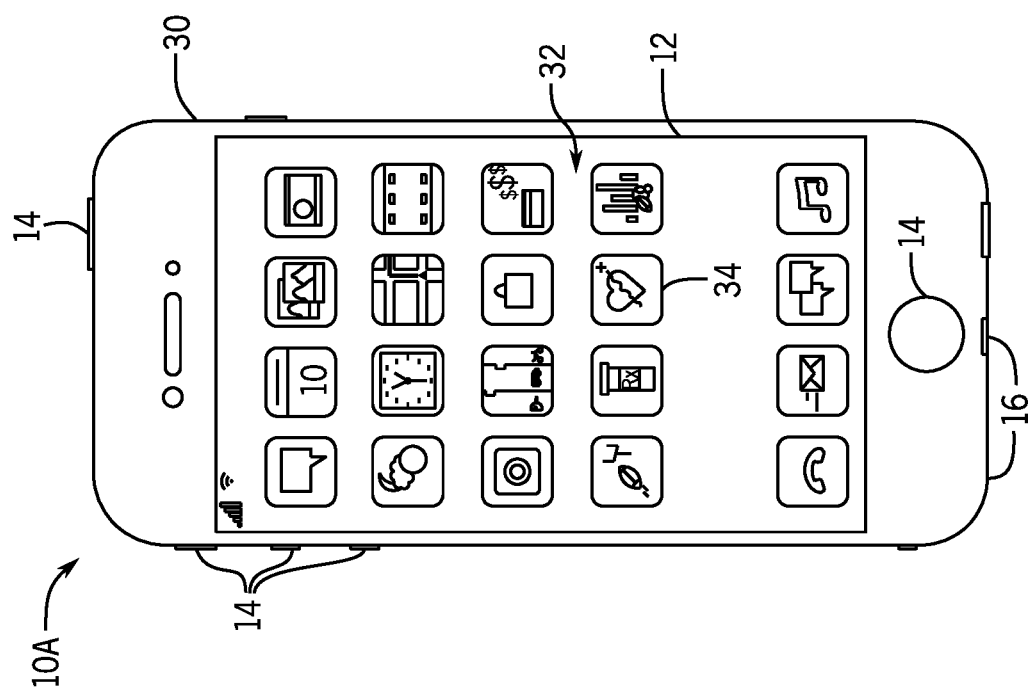
FIG. 2 is an example of the electronic device of FIG. 1, in accordance with an embodiment.

As described above, the electronic device 10 may be any suitable electronic device. To help illustrate, one example of a suitable electronic device 10, specifically a handheld device 10A, is shown in FIG. 2. In some embodiments, the handheld device 10A may be a portable phone, a media player, a personal data organizer, a handheld game platform, and/or the like. For illustrative purposes, the handheld device 10A may be a smart phone, such as any iPhone® model available from Apple Inc.

As depicted, the handheld device 10A includes an enclosure 30 (e.g., housing). In some embodiments, the enclosure 30 may protect interior components from physical damage and/or shield them from electromagnetic interference. Additionally, as depicted, the enclosure 30 may surround the electronic display 12. In the depicted embodiment, the electronic display 12 is displaying a graphical user interface (GUI) 32 having an array of icons 34. By way of example, when an icon 34 is selected either by an input device 14 or a touch-sensing component of the electronic display 12, an application program may launch.

Furthermore, as depicted, input devices 14 may be accessed through openings in the enclosure 30. As described above, the input devices 14 may enable a user to interact with the handheld device 10A. For example, the input devices 14 may enable the user to activate or deactivate the handheld device 10A, navigate a user interface to a home screen, navigate a user interface to a user-configurable application screen, activate a voice-recognition feature, provide volume control, and/or toggle between vibrate and ring modes. As depicted, the I/O ports 16 may be accessed through openings in the enclosure 30. In some embodiments, the I/O ports 16 may include, for example, an audio jack to connect to external devices.

Figure 3:
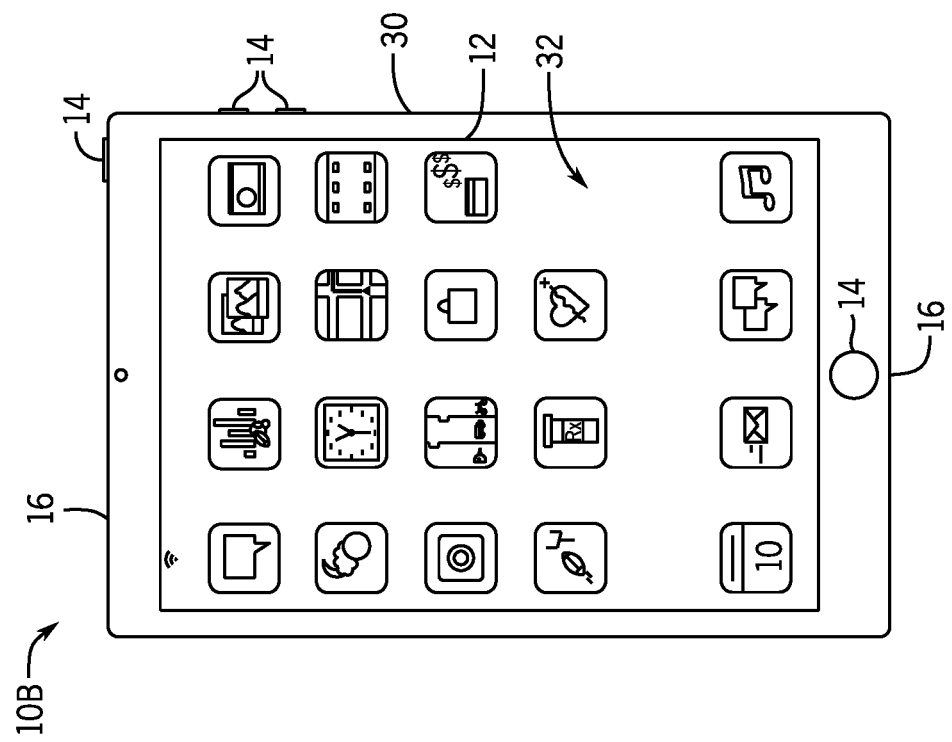
FIG. 3 is another example of the electronic device of FIG. 1, in accordance with an embodiment.
Figure 4:
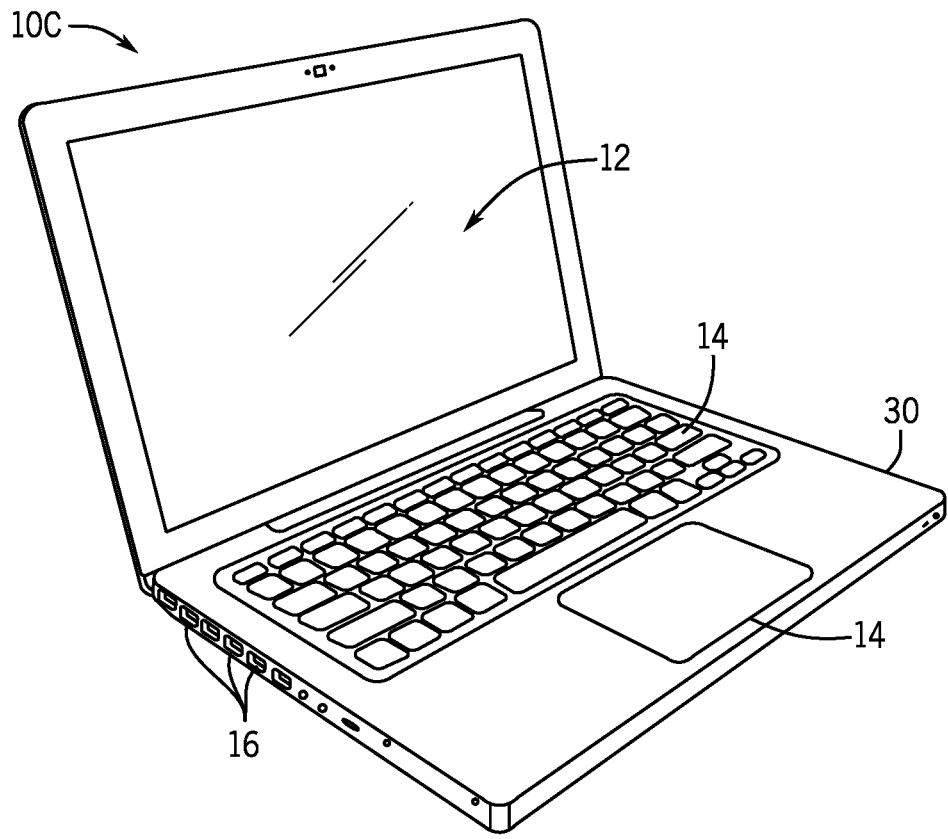
FIG. 4 is another example of the electronic device of FIG. 1, in accordance with an embodiment.
Figure 5:
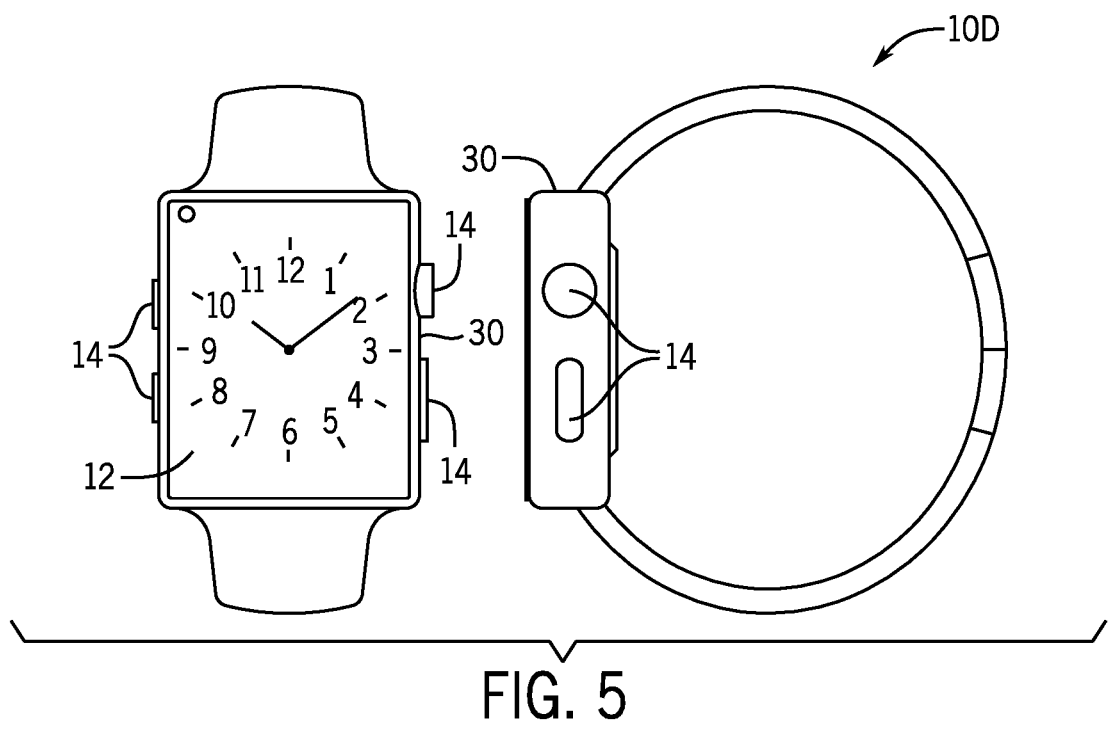
FIG. 5 is another example of the electronic device of FIG. 1, in accordance with an embodiment.

To further illustrate, another example of a suitable electronic device 10, specifically a tablet device 10B, is shown in FIG. 3. For illustrative purposes, the tablet device 10B may be any iPad® model available from Apple Inc. A further example of a suitable electronic device 10, specifically a computer 10C, is shown in FIG. 4. For illustrative purposes, the computer 10C may be any Macbook® or iMac® model available from Apple Inc. Another example of a suitable electronic device 10, specifically a watch 10D, is shown in FIG. 5. For illustrative purposes, the watch 10D may be any Apple Watch® model available from Apple Inc. As depicted, the tablet device 10B, the computer 10C, and the watch 10D each also includes an electronic display 12, input devices 14, I/O ports 16, and an enclosure 30.

Figure 6:
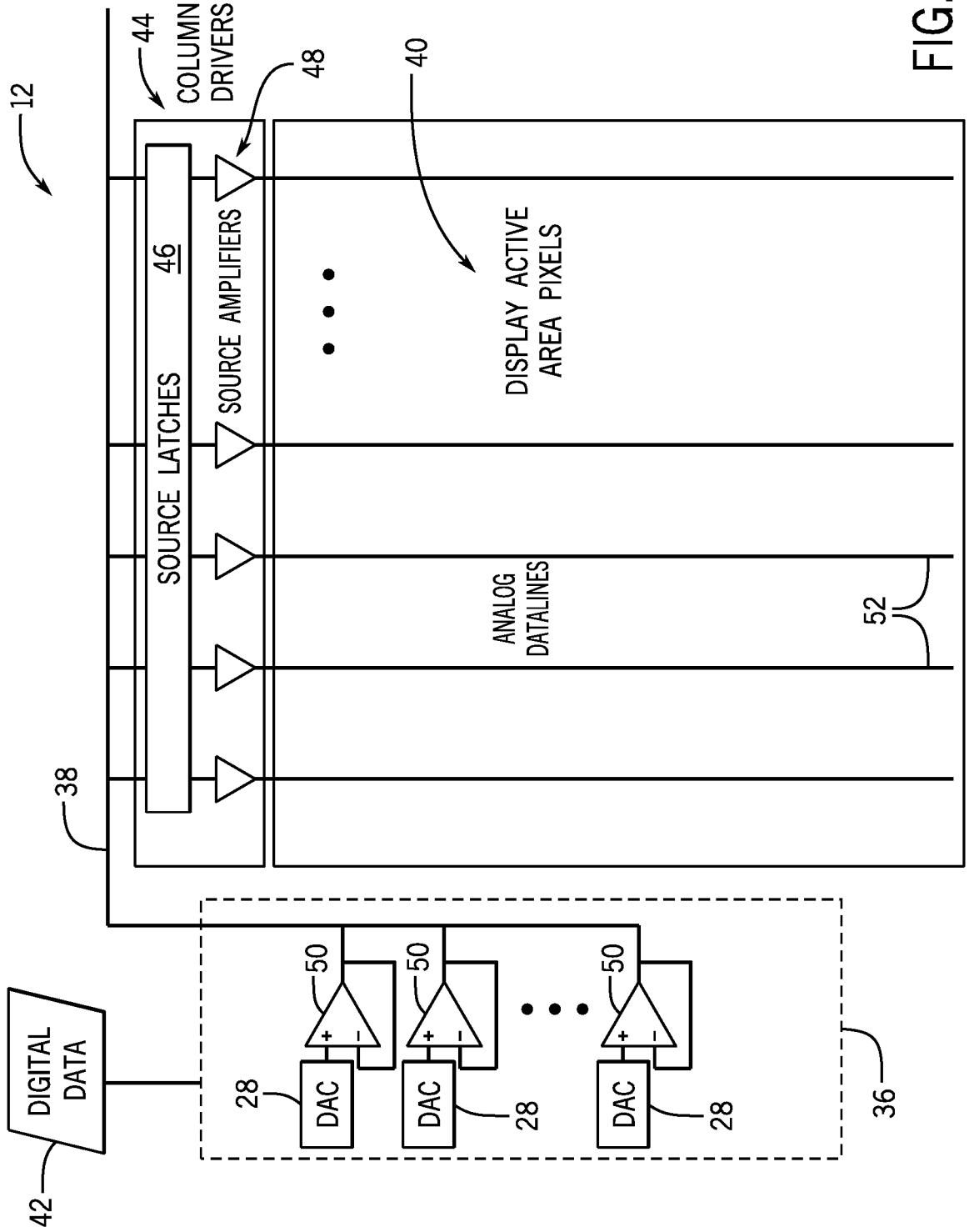
FIG. 6 is a diagrammatic representation of a digital to analog converter in electrical communication with an electronic display, in accordance with an embodiment.

As described above, an electronic device 10 may utilize a DAC 28 to provide analog output voltages to display pixels to facilitate illumination at a target luminance. To help illustrate, a schematic diagram of a portion of the electronic device 10, including a gamma bus 36 with multiple DACs 28 and the electronic display 12, is shown in FIG. 6. As should be appreciated, the DACs 28 are illustrated as part of a gamma bus 36 as a non-limiting example, but the techniques disclosed herein may be applied to any suitable DAC 28.

In some embodiments, the electronic display 12 may use the analog output voltages 38 of a DAC 28 to power display pixels 40 at various voltages that correspond to different luminance levels. For example, digital data 42 (e.g., digital image data) may correspond to original or processed image data and contain target luminance values for each display pixel 40 in an active area of the electronic display 12. Moreover, display circuitry, such as the column drivers 44, also known as data drivers and/or display drivers, may include source latches 46, source amplifiers 48, and/or any other suitable logic/circuitry to select the appropriate analog voltage, and apply power at that voltage to the display pixel 40 to achieve the target luminance output from the display pixel 40.

In some embodiments, power at the output voltage 38 of the DAC 28 may be buffered by one or more buffers 50 (e.g., operational amplifiers) to reduce and/or stabilize the current draw on the output of the DAC 28. Moreover, in some embodiments, the DAC 28 may output a negative voltage relative to a reference point (e.g., ground). In the illustrated example, the buffered output voltage 38 travels down analog datalines 52 to display pixels 40 of the active area.

As discussed above, the different output voltages 38 supplied by the DACs 28 may correspond to the values of the digital data 42. The digital data 42 and corresponding output voltages 38 may be associated with any suitable bit-depth depending on implementation. For example, in the context of image data, 8-bit digital data 42 may correspond to 256 different luminance levels and, therefore, 256 different analog reference voltages per color component. For example, digital data 42 corresponding to 8-bits per color component may yield millions of color combinations as well as define the brightness of the electronic display 12 for a given frame.

Figure 7:
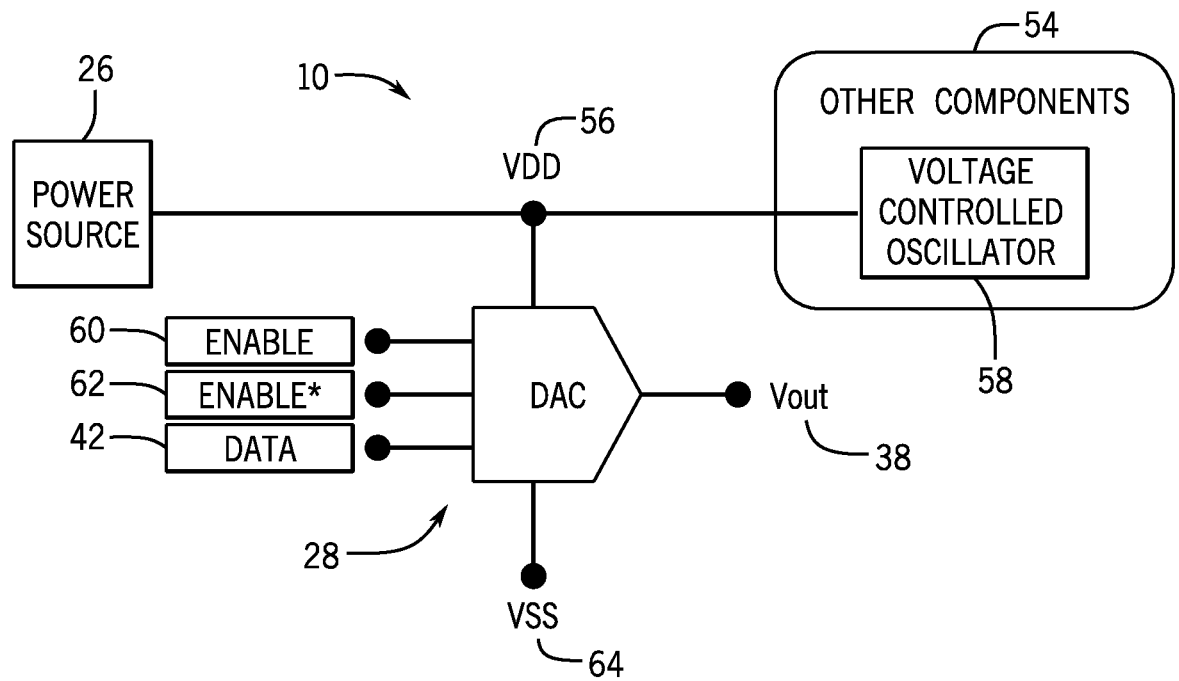
FIG. 7 is a diagrammatic representation a digital to analog converter and other components of an electronic device, in accordance with an embodiment.

FIG. 7 is a diagrammatical view of a DAC 28 of an electronic device 10 in an example environment of the electronic device 10. In some embodiments, the DAC 28 may share a supply voltage (e.g., VDD) 56 with other components 54 of the electronic device 10. For example, the other components 54 may include any powered electronic component of the electronic device 10 (e.g., a voltage controlled oscillator 58) operating at or utilizing the supply voltage 56 or a derivative thereof. Moreover, the DAC 28 may receive the digital data 42 and/or an enable signal 60 and/or a complimentary enable signal 62. The enable signal 60 and/or its compliment, may be provided to enable operation of the DAC 28. For example, if the enable signal 60 is logically "low," relative to a reference voltage 64 (e.g., ground or other relative voltage) the DAC 28 may be disabled and/or draw reduced or zero power. On the other hand, if the enable signal 60 is logically "high," (e.g., relative to the reference voltage 64 and/or the supply voltage 56) the DAC 28 may be enabled for operation. Furthermore, the reference voltage 64 (e.g., VSS) may be provided as a reference for the digital data 42, the enable signal 60, the complimentary enable signal 62, the supply voltage 56, the output voltage 38, or a combination thereof.

Figure 8:
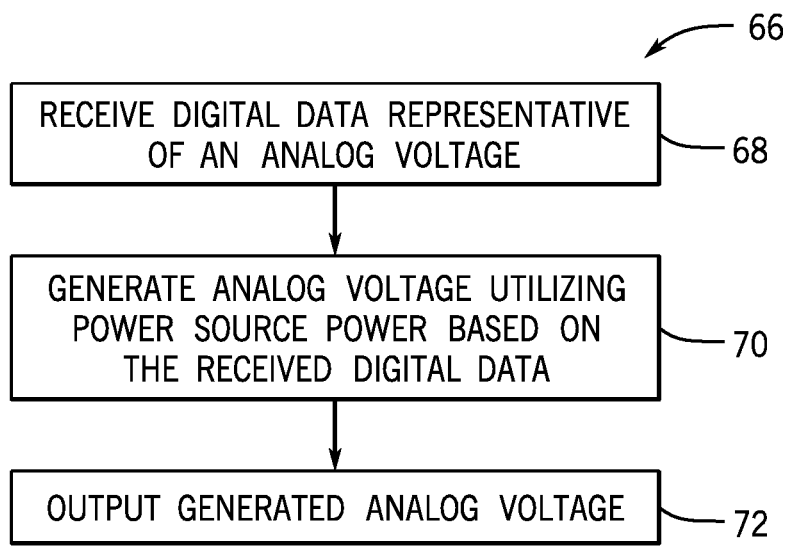
FIG. 8 is a flowchart of an example operation of a digital to analog converter, in accordance with an embodiment.

FIG. 8 is a flowchart 66 for an example operation of the DAC 28. The DAC 28 may receive digital data 42 representative of an analog voltage (process block 68). The DAC 28 may also generate an analog output voltage 38, utilizing power from the power source 26, based on the received digital data 42 (process block 70). The generated analog output voltage 38 can then be output from the DAC 28 (processing block 72).

Returning to FIG. 7, in some scenarios, other components 54 may be sensitive to changes in the supply voltage 56, such as the voltage controlled oscillator 58. In general, voltage controlled oscillators 58 output an oscillating signal, the frequency of which is based on an input voltage (e.g., supply voltage 56). As such, it may be desired to reduce fluctuations in current draw (e.g., by the DAC 28) to reduce possible fluctuations in the supply voltage 56.

Figure 9:
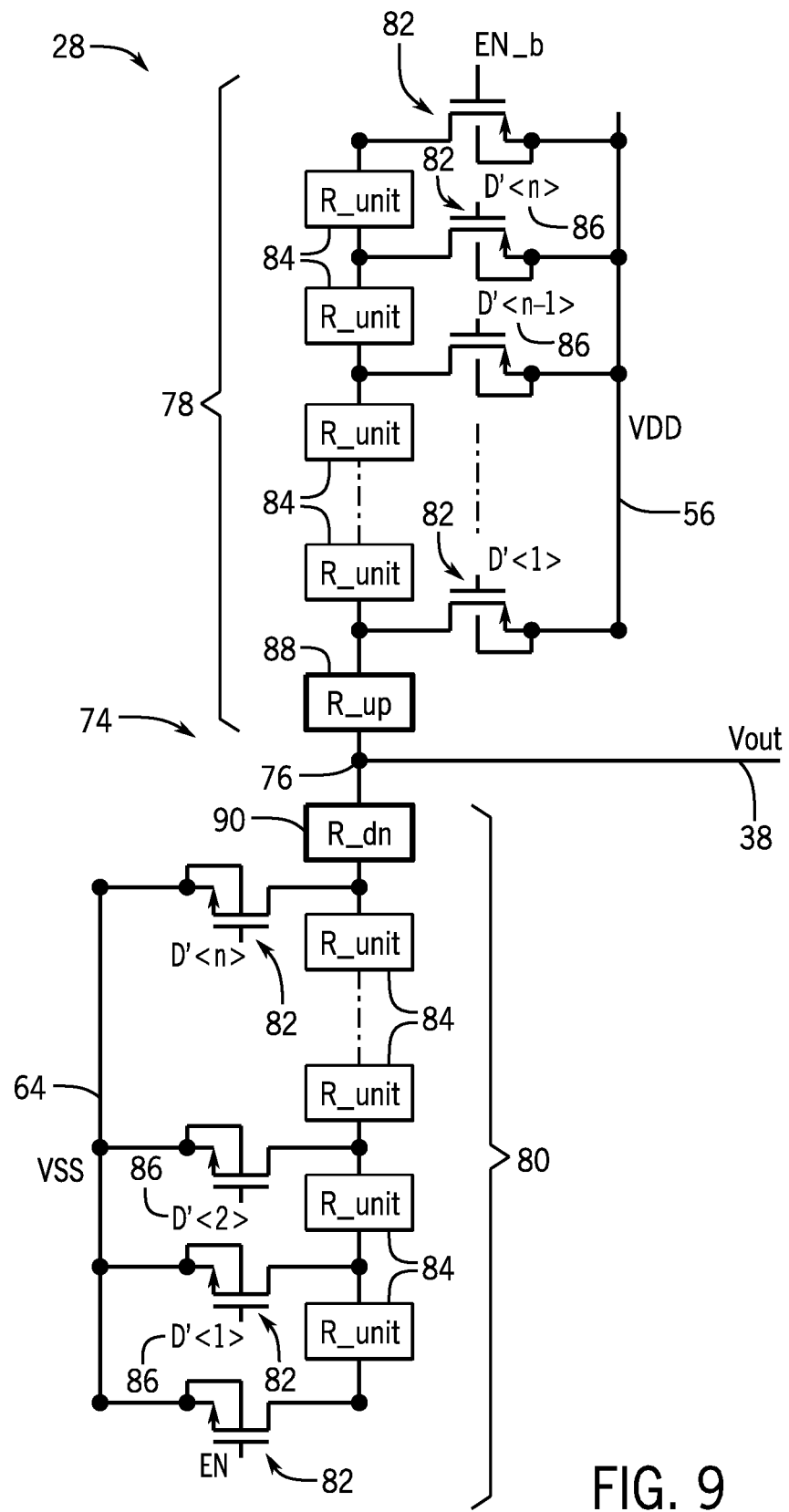
FIG. 9 is a diagrammatic representation of a digital to analog converter, in accordance with an embodiment.

To help maintain a constant current draw of the DAC 28, the supply voltage 56 and the reference voltage 64 may be connected or disconnected from specific points in a resistor ladder 74, as shown in FIG. 9, to change the output voltage 38, at an output node 76 of the resistor ladder 74, while maintaining a constant effective impedance of the resistor ladder 74 as a whole. For example, in one embodiment, the resistor ladder 74 may be divided into a supply section 78 and a reference section 80. Each section 78 and 80 may include one or more switches 82 (e.g., transistors or other electronic switching element) and one or more resistors 84. The switches 82 may be controlled via control signals 86, which may be based upon the digital data 42. In the depicted embodiment, n+1 switches 82 are controlled by n control signals 86 and the enable signal 60 or the complimentary enable signal 62 for each section 78 and 80. In some embodiments, the enable signal 60 and/or the complimentary enable signal 62 may be omitted, and control of the n+1 switches may be controlled by n+1 control signals 86 based on the digital data 42.

By changing which switches 82 are activated, the effective impedance before and after (e.g., relative to current flow) the output node 76 may be changed, thus, changing the output voltage 38. Moreover, by employing resistors 84 of the same value impedance between the switches 82, as one switch 82 is turned on in the supply section 78, one switch 82 may be turned off in the reference section 80 and vice versa. The turning on of a switch 82 may cause resistors 84 of the corresponding section 78 or 80 to be operated in parallel and, therefore, may reduce the effective impedance of the corresponding section 78 or 80. Simultaneously, the other section 78 or 80 may turn off a switch 82 putting more resistors 84 in series, increasing the effective impedance of that section 78 or 80, and, thus, maintaining the overall impedance between the supply voltage 56 and the reference voltage 64 relatively constant. Moreover, in some embodiments, the one-to-one on-off relationship between the supply section 78 and the reference section 80 may also increase coding efficiency and simplicity. For example, as will be discussed further below, the same n control signals 86 may be applied to the switches 82 of the supply section 78 and the reference section 80.

The resistors 84 may have any suitable value depending on implementation. For example, the resistors 84 between the switches 82 may be on the order of 10 Ohms, 100 Ohms, 1 Kiloohm, 1 Megaohm, etc. Further, in some embodiments, the supply section 78 and reference section 80 may have control resistors R_up 88 and R_dn 90, respectively. The control resistors 88 and 90 may not have switches 82 to place them in parallel, but rather stay in series regardless of control signals 86 and output voltage 38. Additionally, because the control resistors 88 and 90 are in series with the other resistors 84, as well as each other, the control resistors 88 and 90 may have independent impedance values from each other and/or the other resistors 84. Furthermore, by adjusting the values of the control resistors R_up 88 and R_dn 90, the dynamic range of output voltages 38 of the DAC 28 may be varied. In some embodiments, the control resistors 88 and 90 may be set to the same impedance value as the other resistors 84 and/or may be omitted.

In addition to the resistors 84, the switches 82 may have an impedance associated with their operation that may alter the effective impedance. To minimize the impedance of the switches 82, in some embodiments, the supply section switches 82 may be turned on by a logically "low," control signal 86, such as PMOS transistors. Additionally, the reference section switches 82 may be turned on by a logically "high," control signal 86, such as NMOS transistors. Furthermore, the sources of the PMOS transistors may be connected to the supply voltage 56 and the sources of the NMOS transistors may be connected to the reference voltage 64. As such, the gate-source voltage differential may be maximized to that of the supply voltage 56 for each switch 82 in the "on" state, which may lead to reduced impedance between the source and the drain of each switch 82. Moreover, in some embodiments, because of the reduced impedance of the switches 82, such impedance may be disregarded when stating that the effective impedance of the resistor ladder 74 is constant.

Figure 10:
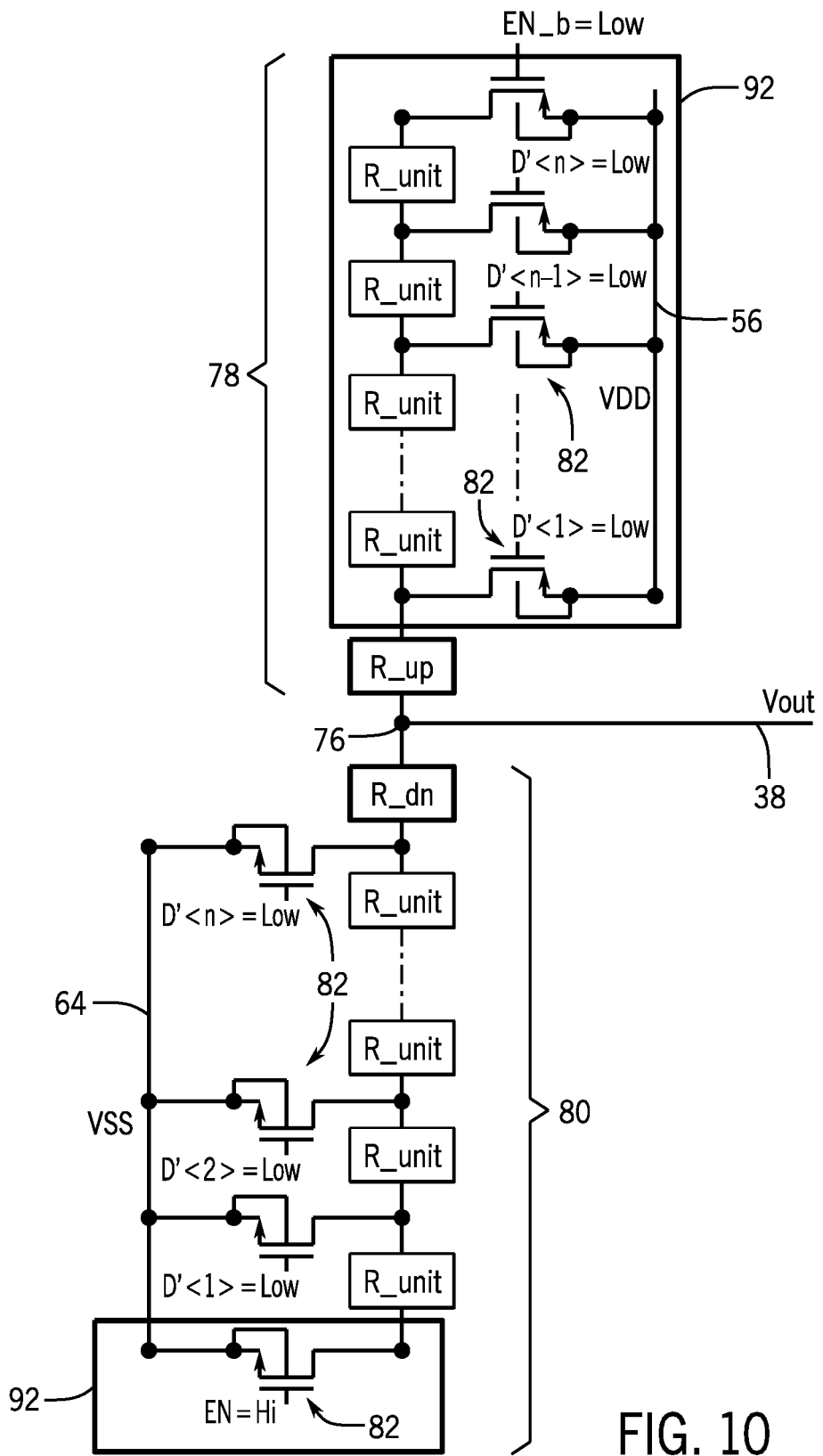
FIG. 10 is a diagrammatic representation of a digital to analog converter, in accordance with an embodiment.

To help illustrate operation, FIG. 10 shows the DAC 28 in a high output state. For example, the majority (e.g., all) of the switches 82 in the supply section 78 may be turned on, as indicated by an operating region 92, to reduce the effective impedance of the supply section 78. Additionally, the switches 82 of the reference section 80 are off except for a single switch 82 at the end of the resistor ladder 74, as indicated by the operating region 92, to maximize the impedance in the reference section 80. As such, the effective impedance of the resistor ladder 74 is the addition of the resistors of the reference section 80 and the control resistors 88 and 90.

Figure 11:
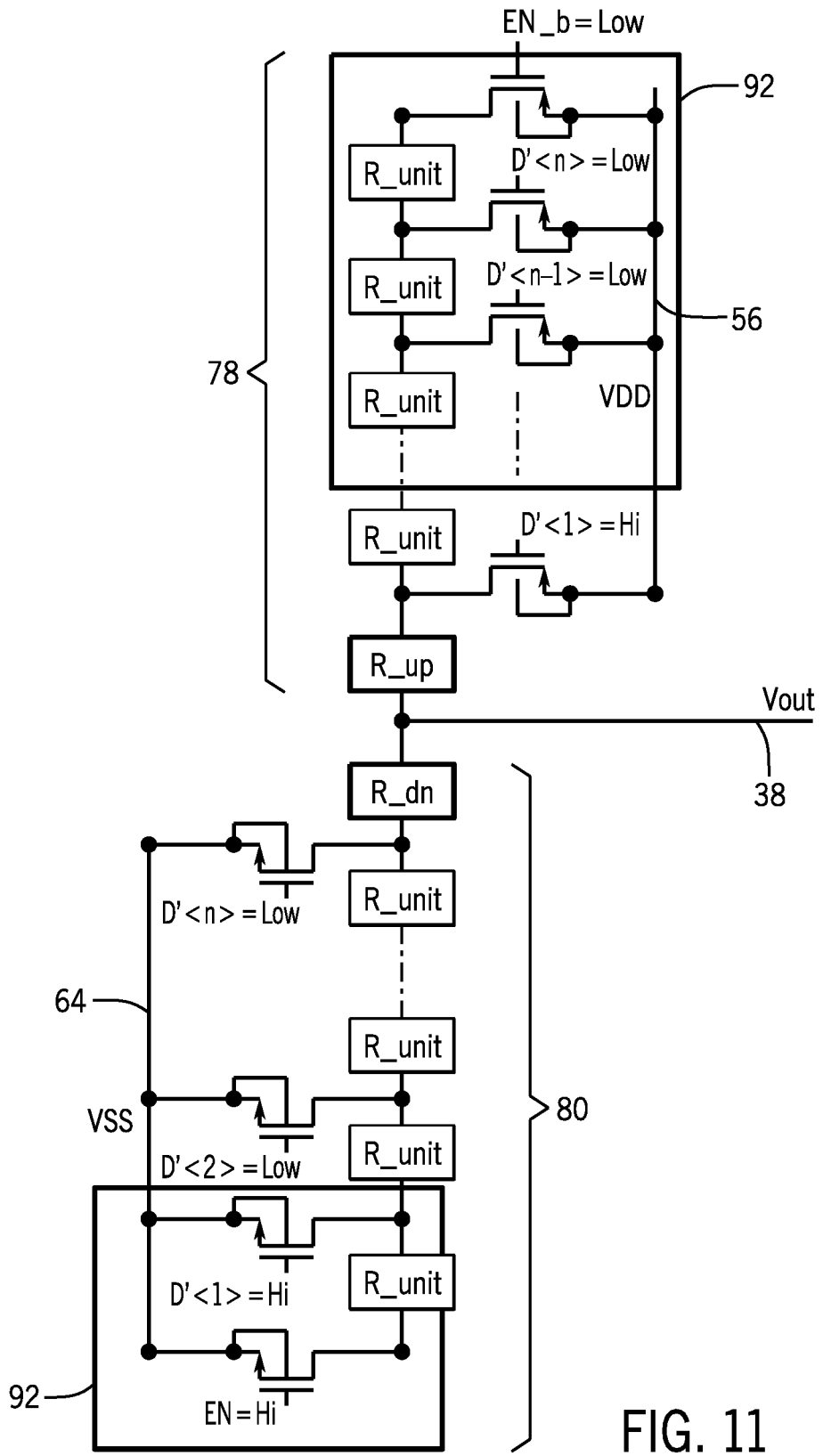
FIG. 11 is a diagrammatic representation of a digital to analog converter, in accordance with an embodiment.

Additionally, FIG. 11 shows the DAC 28 in at a slightly lower output state than that of FIG. 10. For example, all but one of the switches 82 in the supply section 78 are turned on, as indicated by an operating region 92, to reduce the effective impedance of the supply section 78, but still maintain the impedance of at least one resistor 84. Additionally, the switches 82 of the reference section 80 are off except for two switches 82 at the end of the resistor ladder 74, as indicated by the operating region 92, to maintain the same impedance as in the high output state. As such, the effective impedance of the resistor ladder 74 is the addition of all but one of the resistors of the reference section 80, one resistor from the supply section 78, and the control resistors 88 and 90, which is equal to the impedance from the high output state of FIG. 10.

Figure 12:
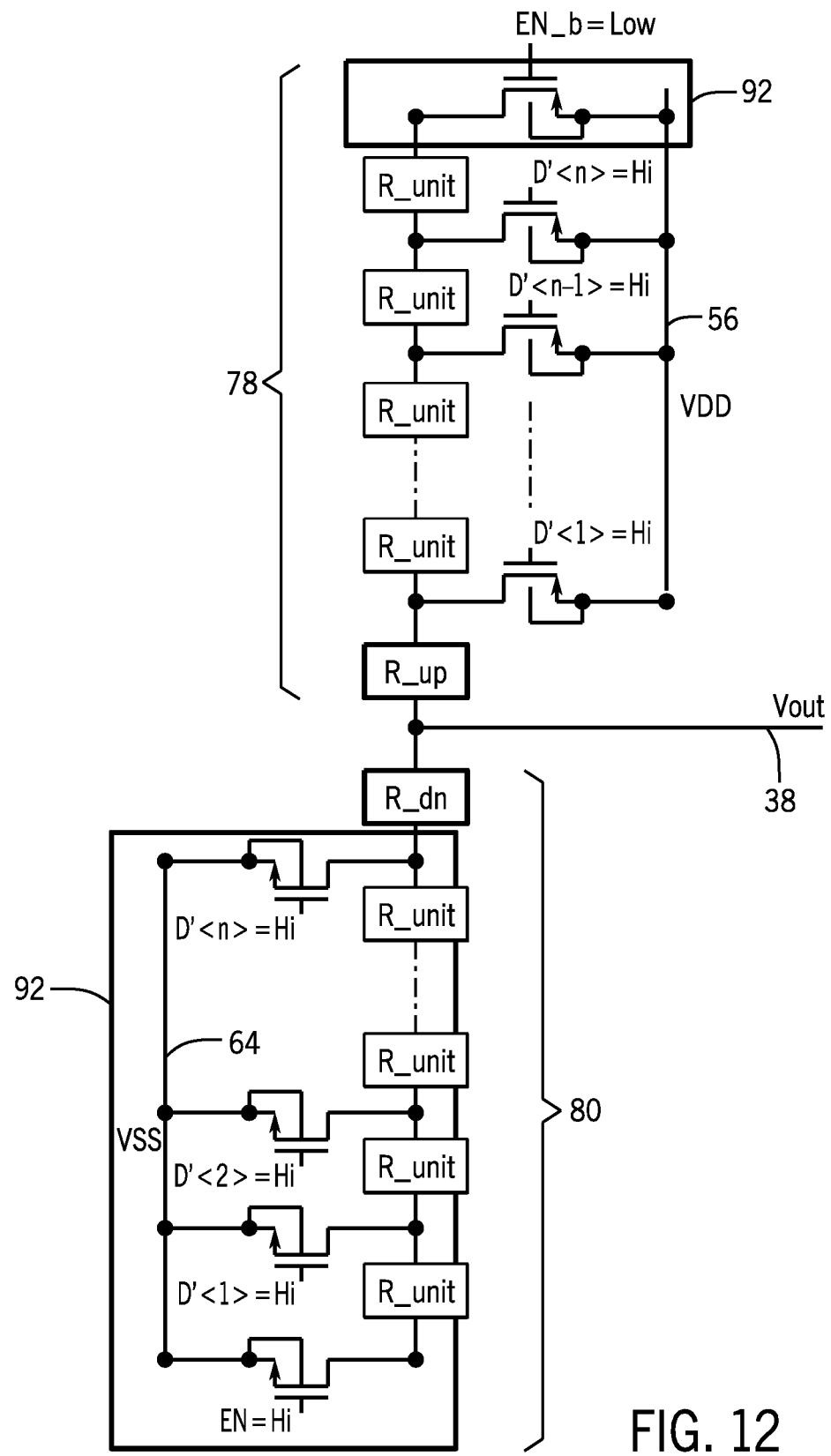
FIG. 12 is a diagrammatic representation of a digital to analog converter, in accordance with an embodiment.

Continuing, FIG. 12 shows the DAC 28 in a low output state, relative to the output states of FIGS. 10 and 11. For example, the majority (e.g., all) of the switches 82 in the reference section 80 may be turned on, as indicated by an operating region 92, to reduce the effective impedance of the reference section 80. Additionally, the switches 82 of the supply section 78 are off except for a single switch 82 at the beginning of the resistor ladder 74, as indicated by the operating region 92, to maximize the impedance in the supply section 78. As such, the effective impedance of the resistor ladder 74 is the addition of the resistors of the supply section 78 and the control resistors 88 and 90, which is equal to the addition of the resistors of the reference section 80 and the control resistors 88 and 90, as shown in FIG. 10.

Figure 13:
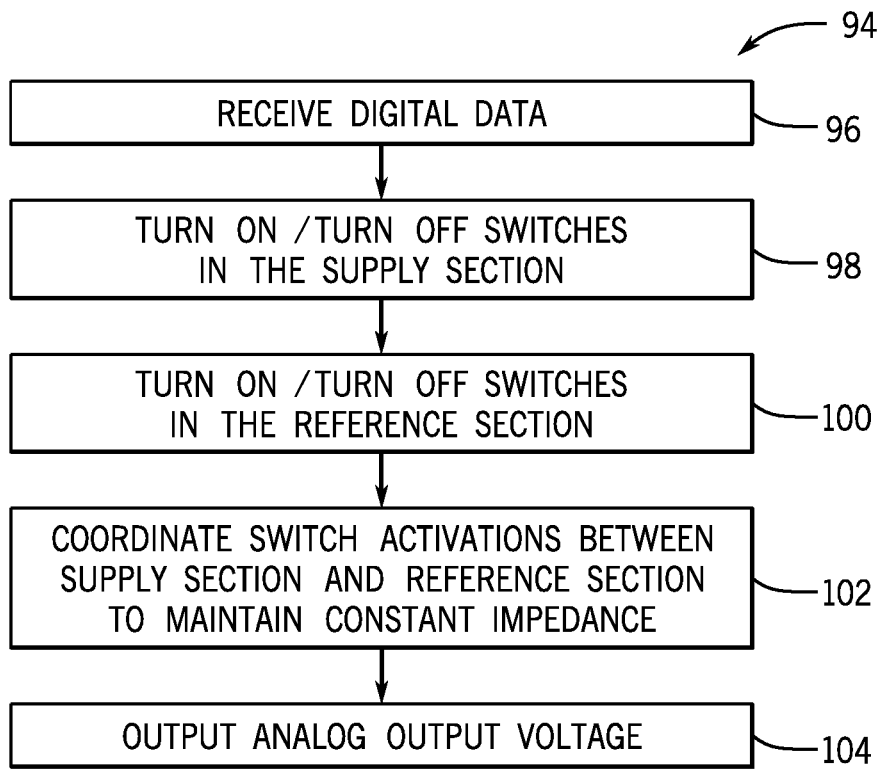
FIG. 13 is a flowchart of an example process for operation of a digital to analog converter, in accordance with an embodiment.

FIG. 13 is a flowchart 94 of an example process for generating the output voltage 38. The DAC 28 may receive the digital data 42 (process block 96). Additionally, the DAC 28 may turn on or turn off switches 82 in the supply section 78 (process block 98) and turn off or turn on, respectively, switches 82 in the reference section 80 (process block 100) such that switch activations between the supply section 78 and the reference section 80 are coordinated to maintain a constant impedance (process block 102). Moreover, the analog output voltage 38 may be output (process block 104), for example, via the output node 76.

As discussed above, the same control signals 86 may be applied to the switches 82 of the supply section 78 and the reference section 80 to increase coding efficiency and simplicity. Additionally, in some embodiments, thermometer coding may also reduce the likelihood of bit-to-bit skew. In some embodiments, the DAC 28 may utilize thermometer coding to facilitate simplified operation of the switches 82 by correlating each digit of the string of digital data 42 to one or more switches 82. For example, as the thermometer coded digital data 42 increases in value by 1, one switch 82 is turned on and one switch 82 is turned off in the opposite section 78 and 80. In some embodiments, the DAC 28 may receive the digital data 42 in a different coding format (e.g., binary, grey-code, etc.) and convert the digital data 42 into the control signals 86 in thermometer code.

Furthermore, as stated above, in some embodiments, the supply section 78 and the reference section 80 may use different types of switches 82 (e.g., PMOS and NMOS), which respond differently to logical "low" and "high." Moreover, having the sections 78 and 80 use different types of switches 82 may also help in simplifying code implementation. For example, n control signals 86 may be sent to the switches 82 of supply section 78 such that the each bit of the bit-string of the thermometer coded digital data is sent to a corresponding switch 82 in order, as depicted in FIGS. 9-12. Likewise, identical thermometer coded digital data 42 may be sent to the switches 82 of the reference section 80. Because the supply section 78 and the reference section 80 are different types of switches 82, the same thermometer coded digital data 42 may turn on a switch 82 in one section 78 or 80 and turn off a switch 82 in the other section 78 or 80. As such, in one embodiment, switches 82 of the supply section 78 may have a corresponding partner in the reference section 80 such that both switches 82 of the cross-section pair are not on simultaneously. Although illustrated as activating and deactivating switches 82 in an order corresponding to the thermometer coding, in some embodiments, a different coding scheme may be utilized such that the switches 82 are not activated or deactivated linearly along the resistor ladder 74, but still retain approximately the same effective impedance throughout the gamut of different output voltages 38.

Figure 14:
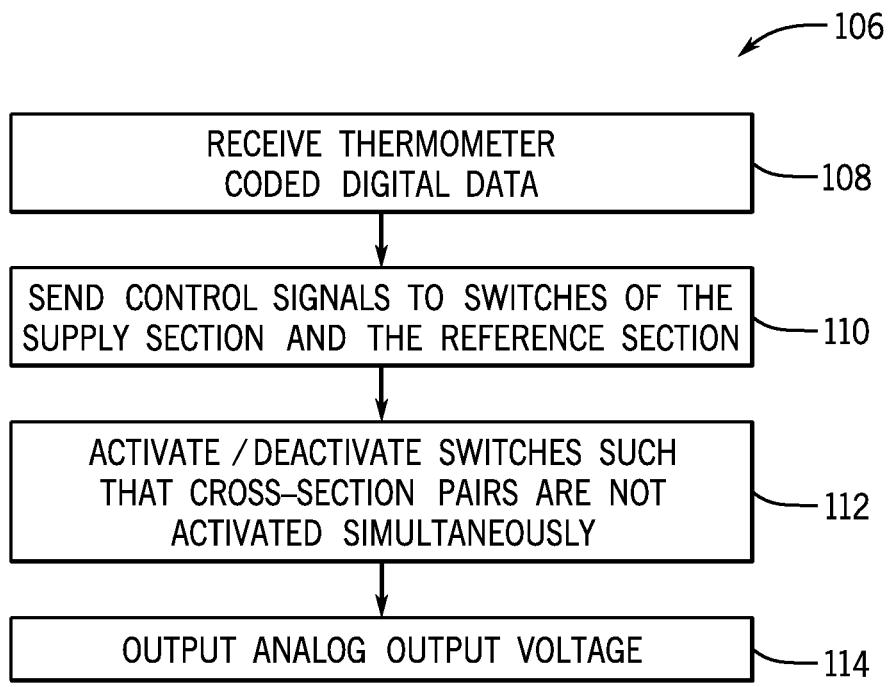
FIG. 14 is a flowchart of an example process for operation of a digital to analog converter, in accordance with an embodiment.

FIG. 14 is a flowchart 106 of an example operation of the DAC 28. The thermometer coded digital data 42 may be received (process block 108), for example via a code converter, and/or directly into the DAC 28. The DAC 28 may send control signals 86 to the switches 82 of the supply section 78 and the reference section 80 (process block 110). The switches 82 in the sections 78 and 80 may be activated or deactivated, based on the control signals 86, such that cross-section pairs of switches 82 are not activated simultaneously (process block 112). Moreover, the analog output voltage 38 may be output (process block 114), for example, via the output node 76.

As discussed herein, by varying the impedance of different sections 78 and 80 of the resistor ladder 74 and/or by utilizing thermometer coding, a DAC 28 of an electronic device 10 may generate analog output voltages 38 that are less susceptible to error and/or have a more uniform current draw on the power source 26, which may lead to less variation in the supply voltage 56. Moreover, although the above referenced flowcharts 66, 94, and 106 are shown in a given order, in certain embodiments, process blocks may be reordered, altered, deleted, and/or occur simultaneously. Additionally, the referenced flowcharts 66, 94, and 106 are given as illustrative tools and further decision and process blocks may also be added depending on implementation.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . ." or "step for [perform]ing [a function] . . .", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electronic device comprising:
    a digital to analog converter configured to:
        receive a plurality of digital signals; and
        output a plurality of analog signals based at least in part on the received plurality of digital signals; and
    a power source configured to supply current to the digital to analog converter;
    wherein the digital to analog converter comprises:
        a first resistor ladder section configured to electrically couple an output node of the digital to analog converter to the power source via a first number of resistors in series;
        a second resistor ladder section configured to electrically couple the output node to a reference voltage via a second number of resistors in series, wherein a sum of the first number of resistors in series and the second number of resistors in series is the same for each of the plurality of analog signals;
        a first control resistor disposed between the power source and the output node; and
        a second control resistor disposed between the reference voltage and the output node, wherein the first control resistor and the second control resistor, in conjunction with each other, are configured to set a dynamic range of the plurality of analog signals independent of the received plurality of digital signals.

2. The electronic device of claim 1, wherein the digital to analog converter comprises:
    a first plurality of switches configured to electrically couple the output node to the power source via the first number of resistors in series; and
    a second plurality of switches configured to electrically couple the output node to the reference voltage via the second number of resistors in series.

3. The electronic device of claim 2, wherein a first switch of the first plurality of switches corresponds to a second switch of the second plurality of switches such that the first switch is not on while the second switch is on.

4. The electronic device of claim 2, wherein the first plurality of switches comprises a plurality of PMOS transistors and the second plurality of switches comprises a plurality of NMOS transistors.

5. The electronic device of claim 4, wherein a source of each of the plurality of PMOS transistors is directly electrically coupled to the power source, and wherein a source of each of the plurality of NMOS transistors is directly electrically coupled to the reference voltage.

6. The electronic device of claim 1, wherein the plurality of digital signals comprise a plurality of thermometer coded digital signals.

7. The electronic device of claim 1, wherein a digital signal, of the plurality of digital signals, corresponding to an analog signal of the plurality of analog signals, comprises a bit string, wherein the digital to analog converter is configured to operate each switch of a first plurality of switches based at least in part on a single bit of the bit string.

8. The electronic device of claim 1, wherein the digital to analog converter is configured to receive an enable signal, wherein in response to the enable signal, the digital to analog converter is configured to draw power from the power source and output an analog signal of the plurality of analog signals.

9. A method comprising:
    receiving, in an digital to analog converter, thermometer coded digital data;
    sending control signals to a plurality of switches based at least in part on the thermometer coded digital data;
    activating a first transistor to electrically couple an output node of the digital to analog converter to a first voltage via a first path, wherein a first control resistor is disposed between the first voltage and the output node; and
    deactivating a second transistor to electrically decouple the output node from a second voltage via a second path such that an effective impedance between the first voltage and the second voltage is the same as before activating the first transistor, wherein a second control resistor is disposed between the second voltage and the output node, wherein the first control resistor and the second control resistor, in conjunction with each other, are configured to set a dynamic range of an analog voltage of the output node independent of the received thermometer coded digital data.

10. The method of claim 9, wherein the digital to analog converter comprises a first resistor ladder section configured to electrically couple the output node to the first voltage via a first number of resistors in series, wherein activating the first transistor changes the first number of resistors in series.

11. The method of claim 10, wherein the digital to analog converter comprises a second resistor ladder section configured to electrically couple the output node to the second voltage via a second number of resistors in series, wherein deactivating the second transistor increases the second number of resistors in series.

12. The method of claim 9, wherein the first transistor and the second transistor comprise a pair of transistors that are not configured to be activated simultaneously.

13. The method of claim 9, comprising converting binary coded digital data to the thermometer coded digital data.

14. The method of claim 9, comprising outputting the analog voltage from the output node, wherein the analog voltage corresponds to a representative value of the thermometer coded digital data.

15. The method of claim 14, wherein outputting the analog voltage comprises buffering the analog voltage via one or more operational amplifiers.

16. A digital to analog converter comprising a resistor ladder comprising:
 a first resistor ladder section configured to electrically couple an output node of the digital to analog converter to a first voltage, wherein a first switch of the first resistor ladder section is configured to, in response to assertion of a first control signal, change a first effective impedance between the first voltage and the output node;
 a second resistor ladder section configured to electrically couple the output node to a second voltage, wherein a second switch of the second resistor ladder section is configured to, in response to assertion of a second control signal, change a second effective impedance between the second voltage and the output node, wherein the first switch and the second switch comprise a linked pair of switches configured to not be on simultaneously, wherein the first control signal and the second control signal are based at least in part on digital data input to the digital to analog converter;
 a first control resistor disposed between the first voltage and the output node; and
 a second control resistor disposed between the second voltage and the output node, wherein the first control resistor and the second control resistor, in conjunction with each other, are configured to set a dynamic range of an analog voltage of the output node independent of the digital data.

17. The digital to analog converter of claim 16, wherein the digital data comprises thermometer coded digital data input to the digital to analog converter.

18. The digital to analog converter of claim 16, wherein the first control signal and the second control signal are the same.

19. The digital to analog converter of claim 16, wherein changing the first effective impedance comprises a first change to a third effective impedance of the resistor ladder between the first voltage and the second voltage, wherein changing the second effective impedance comprises a second change to the third effective impedance, wherein the first change and the second change cancel out.

20. The electronic device of claim 1, wherein the first control resistor comprises a first resistor value and the second control resistor comprises a second resistor value different from the first resistor value.

\* \* \* \* \*